United States Patent [19]
Claridge et al.

[11] Patent Number: 5,459,440
[45] Date of Patent: Oct. 17, 1995

[54] AUTOMATIC IMPEDANCE MATCHING WITH POTENTIAL MONITORING MEANS

[75] Inventors: Philip G. Claridge, Buckinghamshire; David A. Pearce, High Wycombe, both of United Kingdom

[73] Assignee: Madge Networks Limited, Buckinghamshire, United Kingdom

[21] Appl. No.: 229,302

[22] Filed: Apr. 18, 1994

[30] Foreign Application Priority Data

Apr. 20, 1993 [GB] United Kingdom .................. 9308168

[51] Int. Cl.⁶ ..................................... H03H 7/40
[52] U.S. Cl. ..................... 333/17.3; 455/123; 379/398; 379/404; 333/32
[58] Field of Search ............... 333/17.3, 32; 375/36, 375/257; 455/123, 125, 129, 289; 379/340, 398, 402, 403, 404, 394

[56] References Cited

U.S. PATENT DOCUMENTS

| | | | |
|---|---|---|---|
| 4,112,395 | 9/1978 | Seward | 455/123 X |
| 4,209,758 | 6/1980 | Snedkerud et al. | 333/17.3 |
| 4,382,252 | 5/1983 | Ohashi et al. | 333/17.3 X |
| 5,057,783 | 10/1991 | Gubisch | 333/17.3 X |
| 5,136,719 | 8/1992 | Gaskill et al. | 455/289 X |

FOREIGN PATENT DOCUMENTS

| | | |
|---|---|---|
| 580249A2 | 1/1994 | European Pat. Off. . |
| 1320830 | 12/1989 | Japan . |

*Primary Examiner*—Benny T. Lee
*Assistant Examiner*—Justin P. Bettendorf
*Attorney, Agent, or Firm*—Sughrue, Mion, Zinn, Macpeak & Seas

[57] ABSTRACT

A method and apparatus for impedance matching a transmitter to a transmission medium of a communication system during normal operation of the system. The method comprises feeding signals from the transmitter to the transmission medium through a variable impedance; monitoring the potential upstream and downstream of the variable impedance; generating a control signal related to the monitored potentials; and adjusting the impedance of the variable impedance in accordance with the control signal until the monitored potentials satisfy matching conditions in which the transmitter is impedance matched to the transmission medium.

7 Claims, 6 Drawing Sheets

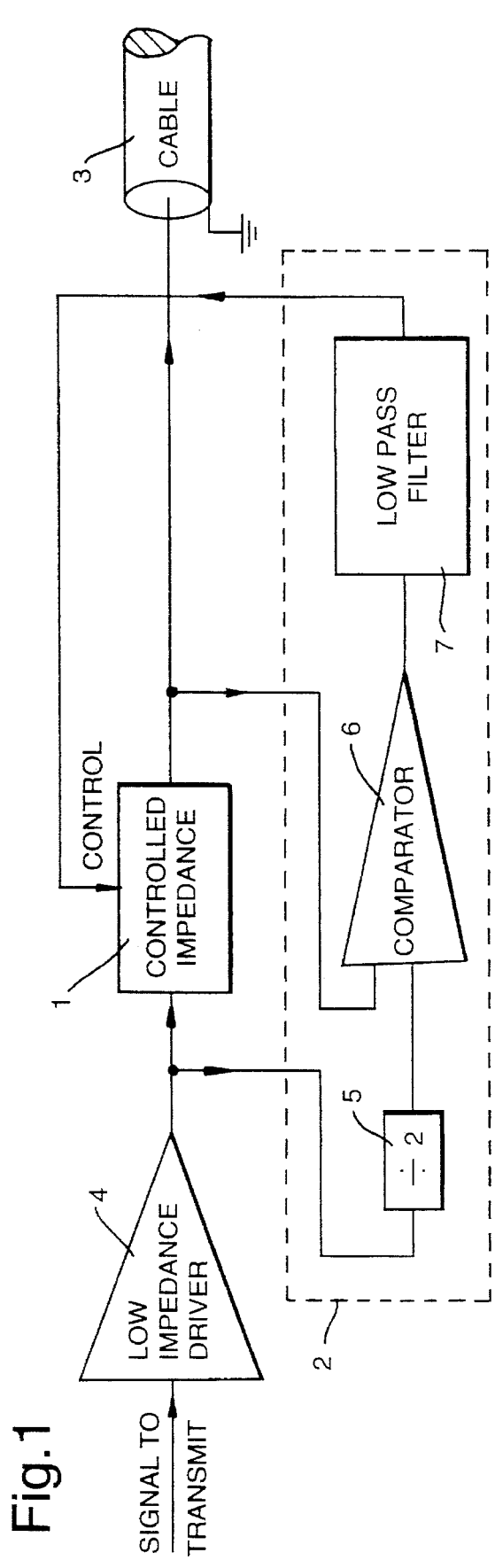
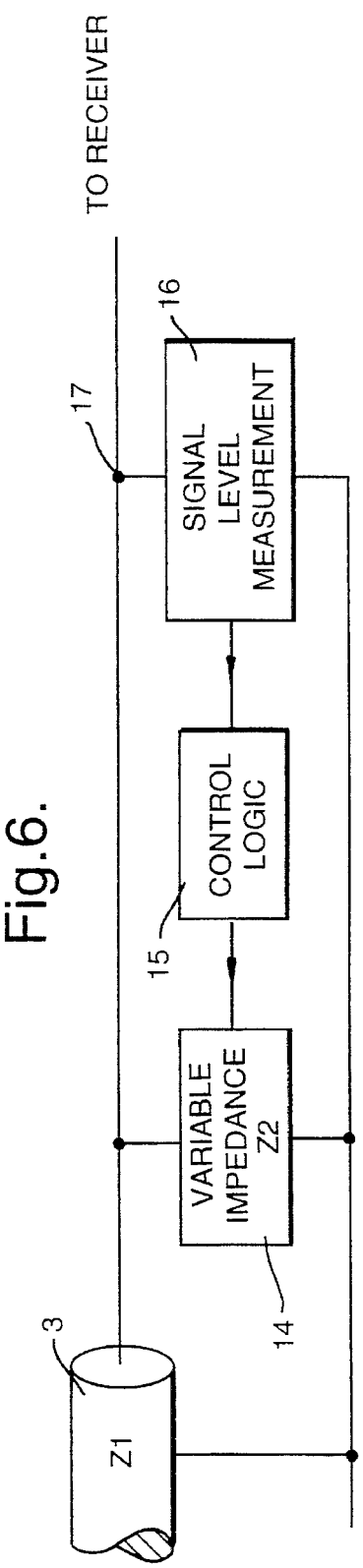

AUTOMATIC IMPEDANCE MATCHING WITH POTENTIAL MONITORING MEANS

FIELD OF THE INVENTION

The invention relates to methods and apparatus for impedance matching a transmitter or receiver to a transmission medium.

DESCRIPTION OF THE PRIOR ART

The performance of communication networks such as token ring networks and indeed any high frequency electrical transmission system depends on the accuracy of the impedance matching between the transmission medium, such as a cable, and the signal transmitter and receiver. In the past, the use of high quality cables has allowed the cable impedance to be well defined, and therefore the design and performance of signal transmitters and receivers can be optimised at the design stage.

The construction of large data networks based on unshielded twisted pair cable designed to many different cable standards means that the cable characteristics (and therefore network performance and error rate) cannot be determined in advance.

U.S. Pat. No. 5,057,783 described test apparatus for connection to a cable of a local area network in order to select a resistance at a value selected from a number of fixed values which best matches the cable impedance. The test apparatus is then removed and the signal transmitter attached. This system suffers from the disadvantage that the cable characteristics can change during use and the resistance which is set by the test apparatus will only be correct at the time at which it is set and thus performance will generally be impaired over time.

U.S. Pat. No. 4,004,102 attempts to monitor the impedance matching characteristics of a network in use by monitoring the peak voltage and peak current applied to the cable, deriving the ratio between the two (that is the impedance) and adjusting the effective resistance of the transmission line. This suffers from the disadvantage of the need for complex circuits to derive the peak voltage and peak current values and is not readily suited to large data networks where many such matching circuits would be required.

SUMMARY OF THE INVENTION

In accordance with one aspect of the present invention, a method of impedance matching a transmitter to a transmission medium of a communication system during normal operation of the system comprises feeding signals from the transmitter to the transmission medium through variable impedance means; monitoring the potential upstream and downstream of the variable impedance means; generating a control signal related to the monitored potentials; and adjusting the impedance of the variable impedance means in accordance with the control signal until the monitored potentials satisfy matching conditions in which the transmitter is impedance matched to the transmission medium.

In accordance with a second aspect of the present invention, apparatus for matching a transmitter to a transmission medium of a communication system during normal operation of the system comprises variable impedance means connected in use between the transmitter and the transmission medium; monitoring means for monitoring the potential upstream and downstream of the variable impedance means; and a control signal generator for generating a control signal related to the monitored potentials, the control signal being fed to the variable impedance means so as to vary the impedance of the variable impedance means until the monitored potentials satisfy matching conditions in which the transmitter is impedance matched to the transmission medium.

The invention provides real time impedance matching in which the impedance matching process is carried out during normal operation of the system without the need to use special test equipment. Furthermore, by monitoring the potential upstream and downstream of the variable impedance means, much simpler circuitry can be used than in the case of U.S. Pat. No. 4,004,102.

Preferably, the matching conditions are satisfied when the potential downstream of the variable impedance means is substantially one half the potential upstream of the impedance matching means. Typically, in this case, the monitoring means includes a divide by two circuit to which the potential upstream of the variable impedance means is fed and a comparator to which the output of the divide by two circuit and a signal corresponding to the potential downstream of the variable impedance means are fed, the output of the comparator constituting the control signal.

In order to prevent rapid changes in the control signal, preferably the output of the comparator is fed to a low pass filter prior to being fed to the variable impedance means.

The variable impedance means typically comprises a FET device, the control signal being fed to the gate of the FET.

The broad concept of the invention, generating a control signal for achieving impedance matching, can be extended to further applications. For example, two sets of the apparatus may be provided where the transmission medium carries differential signalling, the signal from the transmitter being connected directly to one apparatus and via an inverter to the other apparatus.

In the above case, the two sets of apparatus essentially operate independently. In a modification, the control signals generated by the two sets of apparatus can be fed to an averaging circuit, the output of the averaging circuit then being fed to each variable impedance means.

In a further example, again for use with a differential signalling application, apparatus according to the second aspect of the invention is provided for use between a transmitter and one transmission line of the transmission medium, the apparatus further comprising a second variable impedance means coupled to the transmitter in use via an inverter and to a second transmission line of the transmission medium, the impedance of the second variable impedance means being controlled by the control signal generated by the impedance matching apparatus. In this way, the apparatus is simplified to make use of a single control signal generator to control both variable impedance means.

So far, we have discussed the application of the invention to the matching of a transmission medium to a transmitter. The invention can be extended to the matching of a receiver to a transmission medium. In one application, a communication system includes apparatus according to the second aspect of the invention between the transmitter and a transmission medium, the apparatus further including further variable impedance means connected between the transmission medium and a receiver, the impedance of the further variable impedance means being controlled by the control signal generated by the impedance matching apparatus. This is most conveniently achieved where the transmitter and receiver are located in the same area, for example where the transmission medium carries a pair of transmission lines for conducting signals in respectively opposite directions. However, the technique could be extended to the control of a remote receiver although this would require the control signal to be fed alongside the transmission medium to the receiver. In any event, this technique assumes that the transmission medium characteristics are similar for both directions of signalling.

If both transmit and receive impedance control systems are implemented at each end of a transmission medium then, where low pass filters are involved, the filter bandwidths may have to be different to prevent any interaction between the systems at the two ends of the transmission medium.

In accordance with a third aspect of the present invention, a method of impedance matching a receiver to a signal transmission medium of a communication system during normal operation of the system comprises monitoring the potential at a position between the transmission medium and the receiver and downstream of a parallel mounted variable impedance means when the variable impedance means is set to infinite impedance; and thereafter adjusting the impedance of the variable impedance means until the monitored potential is substantially half its original value.

In accordance with a fourth aspect of the present invention, apparatus for impedance matching a receiver to a transmission medium of a communication system during normal operation of the system comprises variable impedance means connected in parallel to a point downstream of the transmission medium; and control means for controlling the impedance of the variable impedance means by performing a method according to the third aspect of the invention.

The third and fourth aspects of the invention provide ways of impedance matching a receiver to a transmission medium without making use of a control signal generated by a method or apparatus according to the first or second aspect of the invention. Typically, the control means will comprise a microprocessor.

It should be understood that although the specification is primarily concerned with the control of resistance characteristics, it is obvious that it can be extended to controlling impedance more generally, in particular controlling capacitance and/or inductance.

BRIEF DESCRIPTION OF THE DRAWINGS

Some examples of methods and apparatus according to the invention will now be described with reference to the accompanying drawings, in which:

FIG. 1 is a block diagram of a first example for connection between a transmitter and a cable;

FIG. 6 illustrates a further example for impedance matching a cable to a receiver; and, FIG. 7 is a modified version of the FIG. 1 example.

DETAILED DESCRIPTION OF THE EMBODIMENTS

Figure 2:
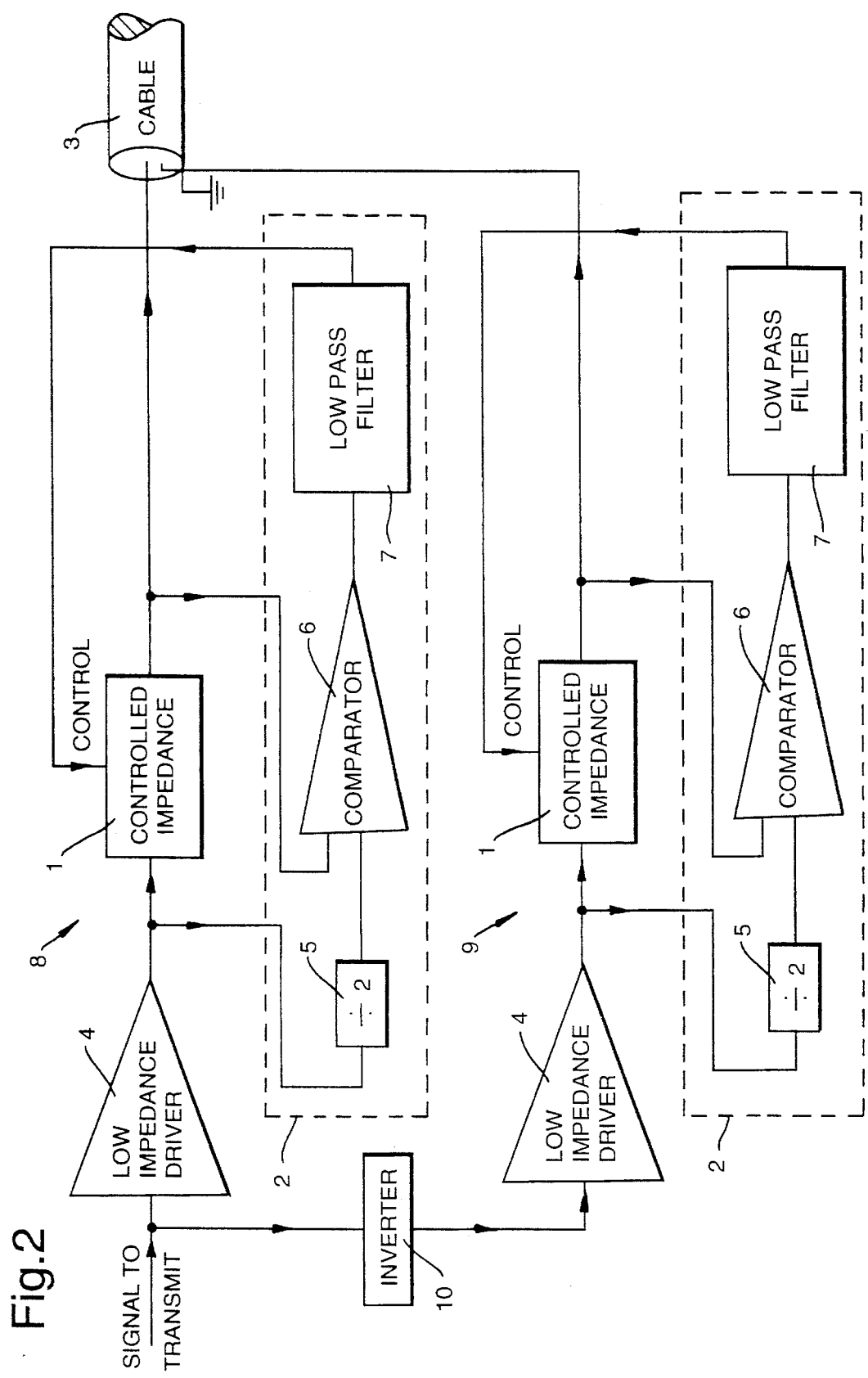
FIG. 2 is a block diagram of a second example for use in a differential signalling application.

The apparatus shown in FIG. 1 comprises a controlled impedance 1, such as a field effect transistor FET, whose impedance is controlled by a control circuit 2 and which is attached in series with a transmission line such as a cable 3.

Signals from a transmitter (not shown) are fed via a low impedance driver 4 to the controlled impedance 1.

The control circuit 2 comprises a divide by two circuit 5 connected to a point up stream of the controlled impedance 1, a comparator 6 to which the output of the divide by two circuit 5 is fed, and a low pass filter 7 to which the output from the comparator 6 is fed, the output from the low pass filter being fed as a control signal to the controlled impedance 1. The other input to the comparator is taken from a point downstream of the controlled impedance 1.

The controlled impedance 1, when matched to the cable impedance, should act as a potential divider and divide the potential upstream of the impedance in half. Consequently, under matching conditions, the two potentials supplied to the comparator 6 should be equal and hence the comparator will generate a null output signal. If the impedances are not the same then the comparator 6 will generate a signal whose magnitude represents the difference between the potentials and whose sign corresponds to the sense in which the two potentials differ. The low pass filter 7 ensures that the circuit achieves a steady state but that the circuit will still track changes in cable characteristics for example due to temperature changes.

Figure 7:
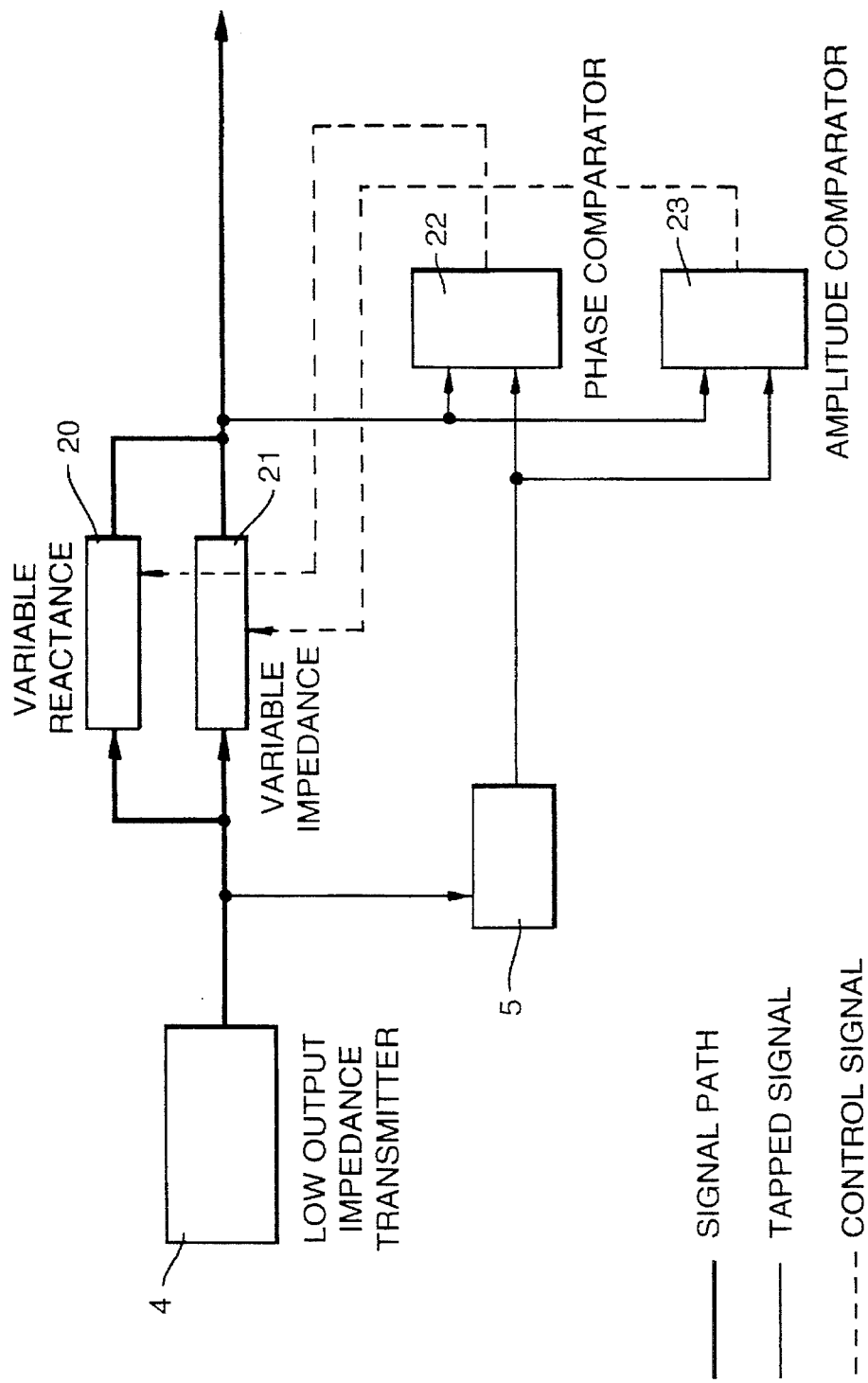

In FIG. 1, the control circuit 2 has been shown as a simple voltage comparator. More generally, the control circuit can be a general purpose amplitude and phase detector and this can control a variable impedance with both resistance and reactive elements to fully match the transmitter to the cable in use. An example of this extension is shown in FIG. 7. In this example, the output from the driver 4 is fed in parallel to a variable reactance 20 and a variable impedance 21. Alternatively (not shown) these could be arranged in series. The reactance and impedance of these components is controlled by a phase comparator 22 and an amplitude comparator 23 respectively. The output from the circuit 5 is fed in parallel to each of the comparators 22 and 23 as is the potential downstream of the reactance and impedance circuits 20 and 21. The phase comparator 22 controls the variable reactance 20 to maintain its two inputs at the same phase while the amplitude comparator 23 controls a variable impedance 21 to maintain its two inputs at the same amplitude.

FIG. 2 illustrates the application of the circuit shown in FIG. 1 to a differential signalling system. In this case, two impedance matching circuits 8 and 9 have been used, each having the same construction as shown in Figure 1 and consequently the same reference numerals have been used in each case. Impedance drivers 4 are connected upstream of each of the circuits 8 and 9 while the circuit 9 is fed with the inverted version of the signal from the transmitter obtained via an inverter 10. Operation of these circuits will be self-evident each acting independently of the other.

Figure 3:
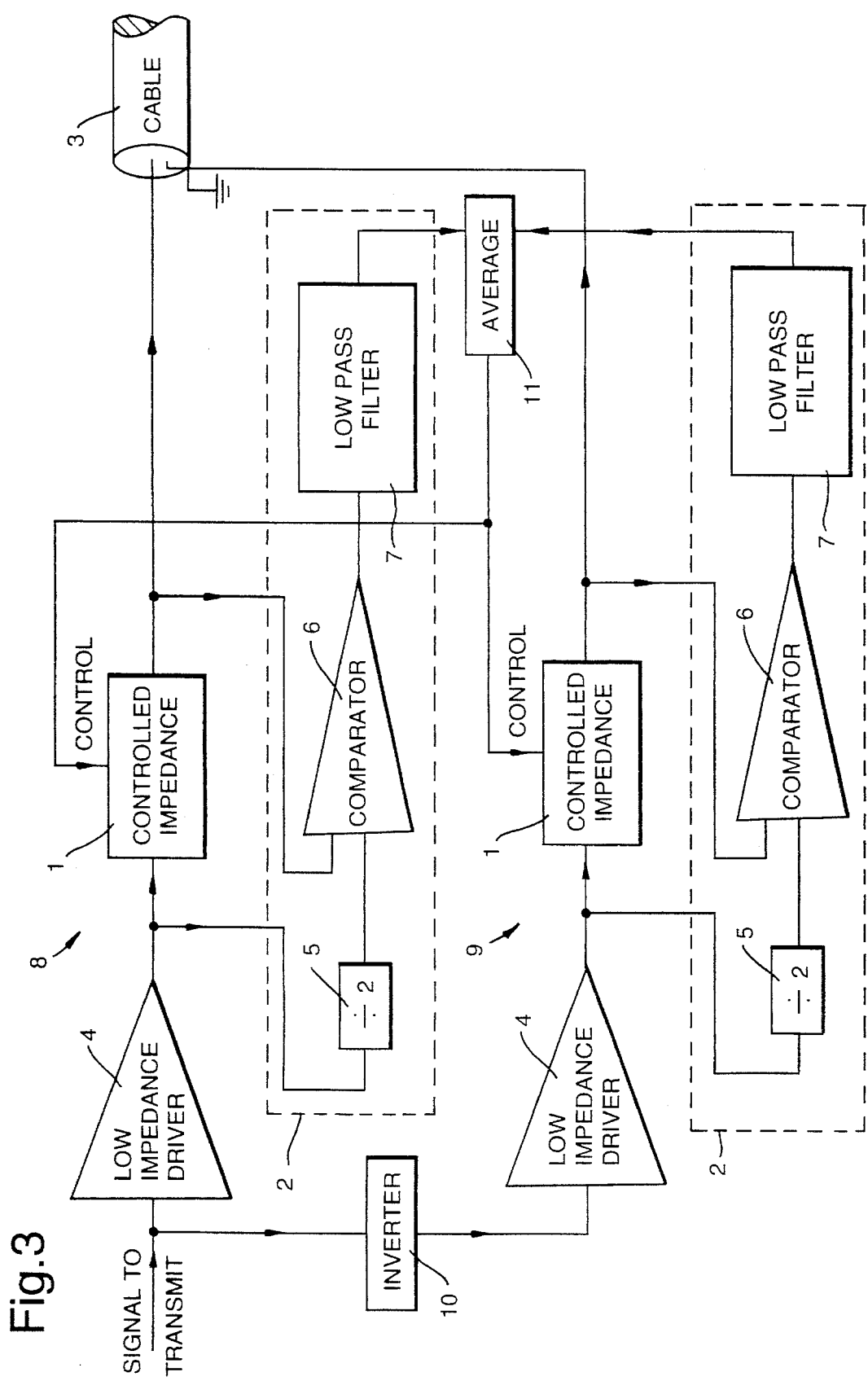
FIG. 3 is a modified version of the FIG. 2 example.

FIG. 3 illustrates a modification of the FIG. 2 example in which the two circuits 8 and 9 do not act independently. Instead, the control signals output from the respective low pass filters 7 are fed to an averaging circuit 11 whose output is fed in common as the control signals to both controlled impedances 1.

Figure 4:
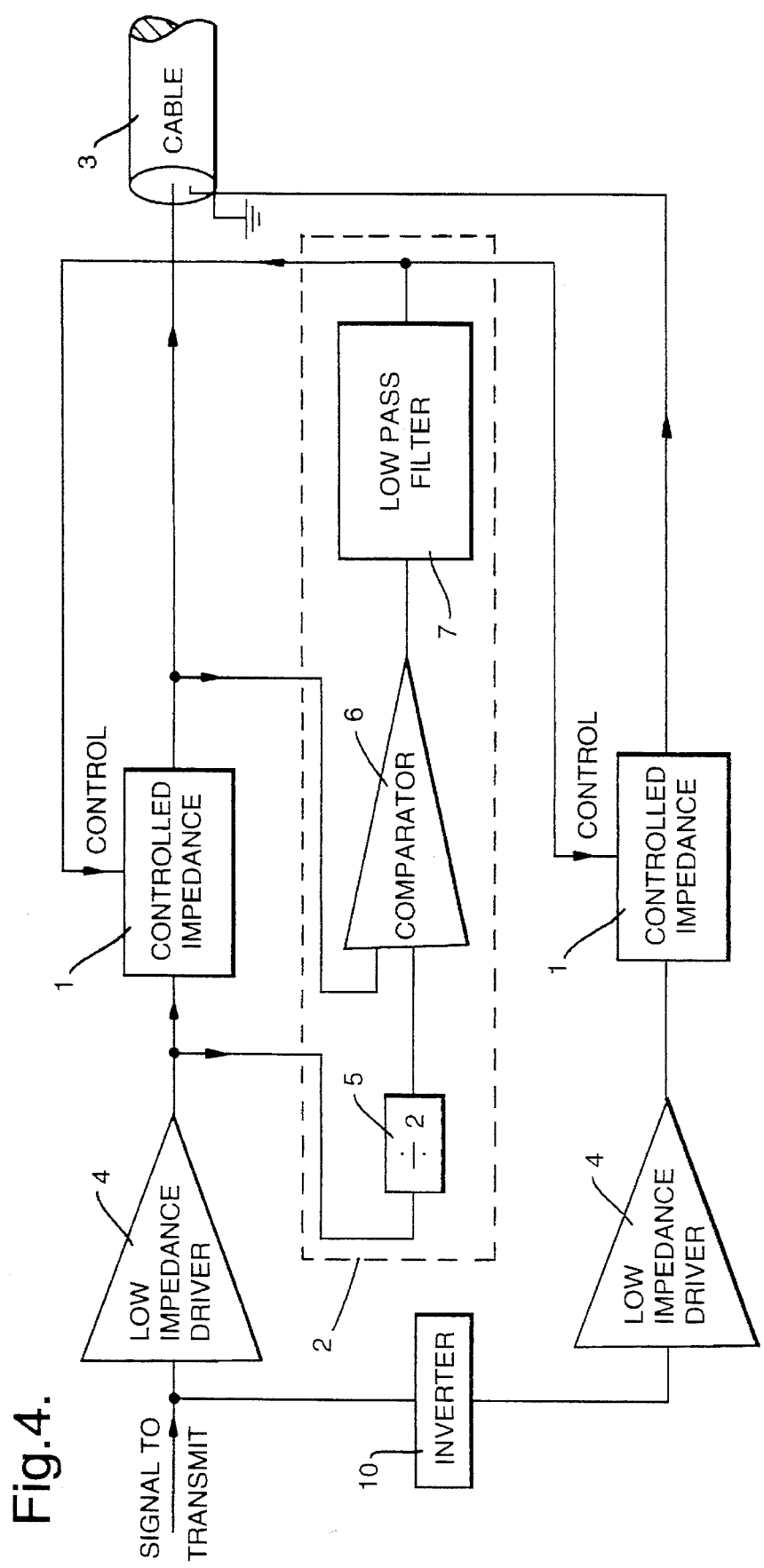
FIG. 4 is a further modification of the FIG. 2 example.

FIG. 4 illustrates a simplified circuit for use with a differential signalling system. In this case, a single control circuit 2 is provided which generates a control signal which is applied directly, in common, to both controlled impedances 1.

Figure 5:
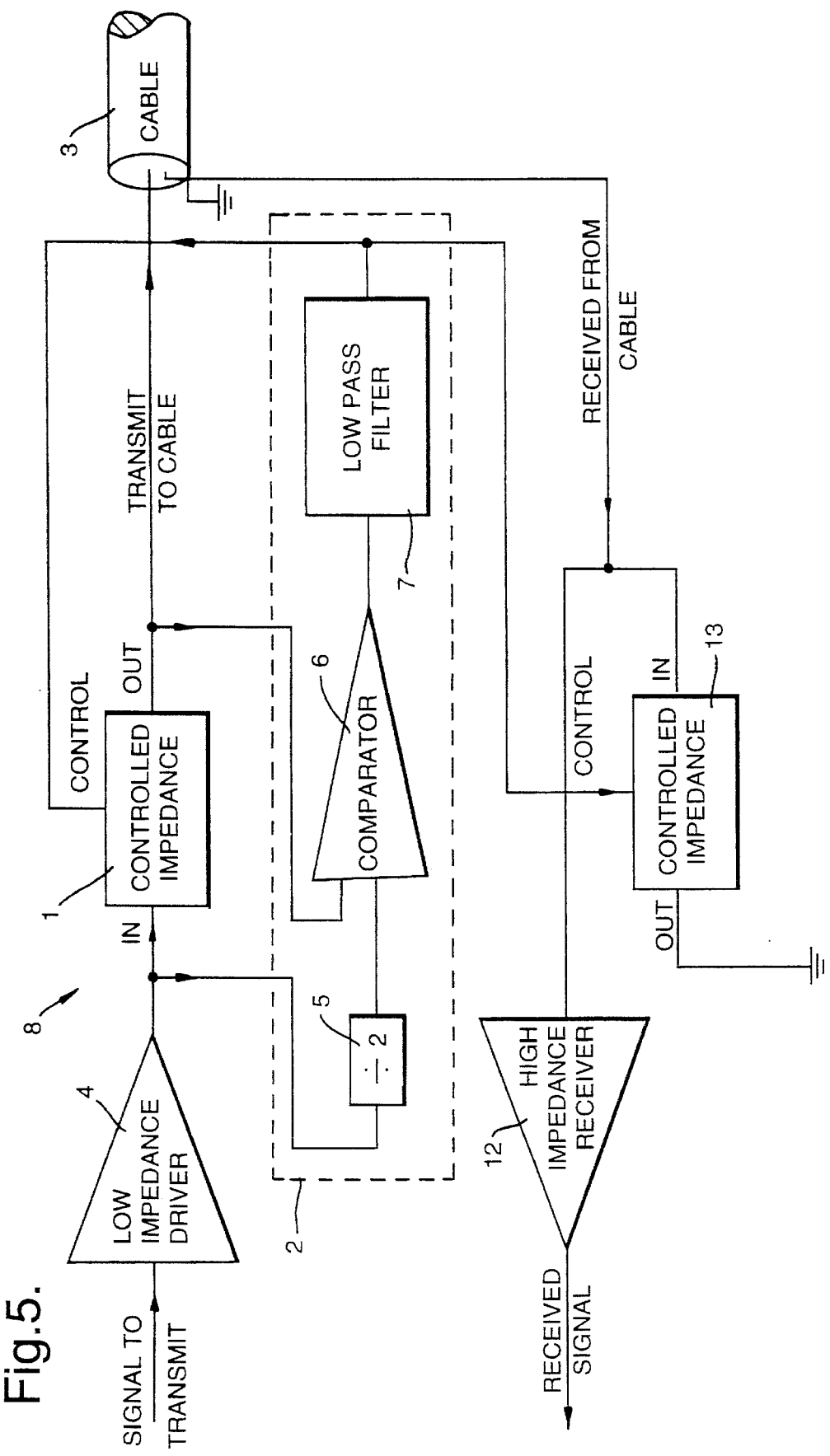
FIG. 5 illustrates apparatus for impedance matching a transmitter and a receiver to a cable.

FIG. 5 illustrates one example of impedance matching a receiver to the cable. In this example, a single impedance matching circuit 8 is used, placed between a transmitter and the cable 3 as before. Signals received from the cable 3 are fed in parallel firstly via a high impedance receive circuit 12 to a receiver (not shown) and secondly to a controlled impedance 13. The impedance of the controlled impedance 13 is then controlled by the control signal generated by the impedance matching circuit 8. In this case, the transmitter and receiver are placed at the same end of the cable 3. In other examples, the control signal derived at one end of the cable could be used to control impedance matching to a receiver at the other end of the cable although this would require the control signal to be fed alongside the cable to the receiver.

FIG. 6 illustrates schematically a system for independently impedance matching a receiver to the cable 3. In this case, a variable impedance 14 is connected to a point downstream of the cable 3 while a control circuit 15 is connected in parallel. A signal level measurement circuit 16 monitors the potential at the point 17 while the control circuit 15 includes a microprocessor which can store the monitored potential and generate a control signal to the variable impedance 14. By setting the value of impedance 14 to a series of known values, and measuring the signal level at 17, the impedance of the cable 3 can be calculated and impedance matching achieved.

In practice for a number of cable cores there might only be one set of control logic and measurement that is switched across many different cable cores. However a variable impedance would be needed for each cable core controlled.

The apparatus shown in the drawings can be used in any signal transmitting or receiving system including local area networks such as token ring or FDDI networks.

We claim:

1. A system for providing impedance matching between a transmitter and a differential signalling transmission medium, the system comprising two sets of matching apparatus, each set of matching apparatus comprising variable impedance means connected in use between the transmitter and the transmission medium; monitoring means for monitoring the potential upstream and downstream of said variable impedance means; and a control signal generator for generating a control signal related to said monitored potentials, said control signal being fed to said variable impedance means so as to vary the impedance of said variable impedance means until the monitored potentials satisfy matching conditions in which the transmitter is impedance matched to the transmission medium, and wherein signals from the transmitter are connected directly to one of said sets of matching apparatus and via an inverter to the other of said sets of matching apparatus.

2. A system according to claim 1, further comprising an averaging circuit to which the control signals generated by said two sets of impedance matching apparatus are fed, the output of said averaging circuit then being fed to each variable impedance means.

3. Apparatus for matching a transmitter to a transmission medium of a communication system during normal operation of the system, the apparatus comprising first variable impedance means connected in use between the transmitter and the transmission medium; monitoring means for monitoring the potential upstream and downstream of said variable impedance means; a control signal generator for generating a control signal related to said monitored potentials, said control signal being fed to said variable impedance means so as to vary the impedance of said variable impedance means until the monitored potentials satisfy matching conditions in which the transmitter is impedance matched to the transmission medium; and second variable impedance means connected between the transmission medium and a receiver, the impedance of said second variable impedance means being controlled by the control signal generated by said impedance matching apparatus.

4. Apparatus according to claim 3, wherein said monitoring means includes a divide by two circuit to which the potential upstream of the variable impedance means is fed and a comparator to which the output of said divide by two circuit and a signal corresponding to the potential downstream of the variable impedance means are fed, the output of said comparator constituting the control signal.

5. Apparatus according to claim 4, wherein the output of said comparator is fed to a low pass filter prior to being fed to said variable impedance means.

6. Apparatus according to claim 3, wherein said first variable impedance means comprises a FET device.

7. Apparatus for providing impedance matching between a transmitter and a differential signalling medium, the system comprising impedance matching apparatus connected in use between a transmitter and the transmission medium, the matching apparatus comprising variable impedance means connected in use between the transmitter and the transmission medium; monitoring means for monitoring the potential upstream and downstream of said variable impedance means; and a control signal generator for generating a control signal related to said monitored potentials, said control signal being fed to said variable impedance means so as to vary the impedance of said variable impedance means until the monitored potentials satisfy matching conditions in which the transmitter is impedance matched to the transmission medium, the system further comprising a second variable impedance means coupled to the transmitter via an inverter and to a second transmission line of the transmission medium, the impedance of said second variable impedance means being controlled by the control signal generated by said impedance matching apparatus.

* * * * *